US011594395B2

(12) United States Patent
Wang et al.

(10) Patent No.: US 11,594,395 B2
(45) Date of Patent: Feb. 28, 2023

(54) PIXEL SHAPE AND SECTION SHAPE SELECTION FOR LARGE ACTIVE AREA HIGH SPEED DETECTOR

(71) Applicant: ASML Netherlands B.V., Veldhoven (NL)

(72) Inventors: Yongxin Wang, San Ramon, CA (US); Zhonghua Dong, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/049,329

(22) PCT Filed: Mar. 21, 2019

(86) PCT No.: PCT/EP2019/057126
§ 371 (c)(1),
(2) Date: Oct. 20, 2020

(87) PCT Pub. No.: WO2019/201544
PCT Pub. Date: Oct. 24, 2019

(65) Prior Publication Data
US 2021/0043416 A1      Feb. 11, 2021

Related U.S. Application Data

(60) Provisional application No. 62/660,765, filed on Apr. 20, 2018.

(51) Int. Cl.
*H01J 37/244*     (2006.01)
*H01L 27/146*    (2006.01)

(52) U.S. Cl.
CPC ...... *H01J 37/244* (2013.01); *H01L 27/14607* (2013.01); *H01L 27/14643* (2013.01);
(Continued)

(58) Field of Classification Search
CPC .. H01J 37/244; H01J 37/2441; H01J 37/2446; H01J 37/24592; G01T 1/24; G01T 1/241
See application file for complete search history.

(56) References Cited

U.S. PATENT DOCUMENTS 5,164,583 A    11/1992  Aichinger et al.
6,137,151 A    10/2000  Street
(Continued)

FOREIGN PATENT DOCUMENTS

CN     103167252 A      6/2013
DE   102008018792 A1    2/2009
(Continued)

OTHER PUBLICATIONS

Notice of Reasons for Rejection issued in related Japanese Patent Application No. 2020-512819; dated Jul. 15, 2021 (1 pgs.).
(Continued)

*Primary Examiner* — David E Smith
(74) *Attorney, Agent, or Firm* — Finnegan, Henderson, Farabow, Garrett & Dunner, LLP

(57) ABSTRACT

Detectors and detection systems are disclosed. According to certain embodiments, a detector comprises a substrate comprising a plurality of sensing elements including a first sensing element and a second sensing element, wherein at least the first sensing element is formed in a triangular shape. The detector may include a switching region configured to connect the first sensing 5 element and the second sensing element. There may also be provided a plurality of sections including a first section connecting a first plurality of sensing elements to a first output and a second section connecting a second plurality of sensing elements to a second output. The section may be provided in a hexagonal shape.

20 Claims, 18 Drawing Sheets

(52) U.S. Cl.
CPC ............... *H01J 2237/2441* (2013.01); *H01J 2237/2446* (2013.01); *H01J 2237/24592* (2013.01)

(56) References Cited

U.S. PATENT DOCUMENTS

| | | | |
|---|---|---|---|
| 6,510,195 B1 | 1/2003 | Chappo et al. | |
| 9,117,711 B2* | 8/2015 | Suzuki | H01L 27/14607 |
| 2004/0075054 A1 | 4/2004 | Meyer | |
| 2009/0302228 A1* | 12/2009 | Hadjioannou | B01L 3/502715 250/371 |
| 2011/0079729 A1 | 4/2011 | Partain et al. | |
| 2013/0153748 A1 | 6/2013 | Suzuki et al. | |
| 2013/0163722 A1* | 6/2013 | Okada | G01N 23/04 378/62 |
| 2017/0269237 A1* | 9/2017 | Cao | H01L 27/14634 |

FOREIGN PATENT DOCUMENTS

| | | | |
|---|---|---|---|
| EP | 3214656 A1 | | 6/2017 |
| JP | 03283673 A | * | 12/1991 |
| JP | H03-283673 A | | 12/1991 |
| JP | H 03283673 A | | 12/1991 |
| JP | H04-263837 | | 9/1992 |
| JP | 2004134387 A | | 4/2004 |
| JP | 2013-079927 A | | 5/2013 |
| JP | 2013-125861 | | 6/2013 |
| JP | 2013-132034 A | | 7/2013 |
| JP | 2013-150304 | | 8/2013 |
| TW | 201643563 A | | 12/2016 |
| WO | WO 2009/141606 A1 | | 11/2009 |
| WO | WO 2018/078956 A1 | | 5/2018 |

OTHER PUBLICATIONS

Notice of Reasons for Rejection issued in related Japanese Patent Application No. 2020-553630; dated Nov. 29, 2021 (5 pgs.).
International Search Report and Written Opinion issued in related PCT International Application No. PCT/EP2019/057126, dated Jun. 25, 2019 (18 pgs.).
Notification for Reason(s) for Refusal from the Korean Intellectual Property Office issued in related Korean Patent Application No. 10-2020-7029918; dated Jul. 21, 2022 (11 pgs.).

* cited by examiner

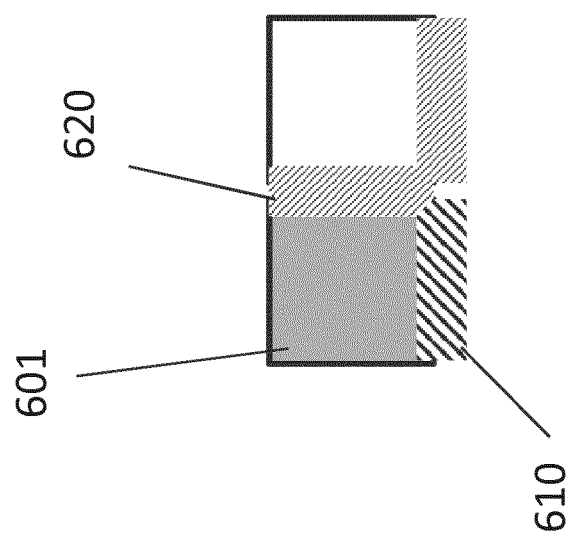
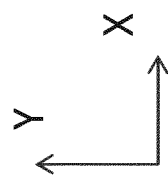
FIG. 6

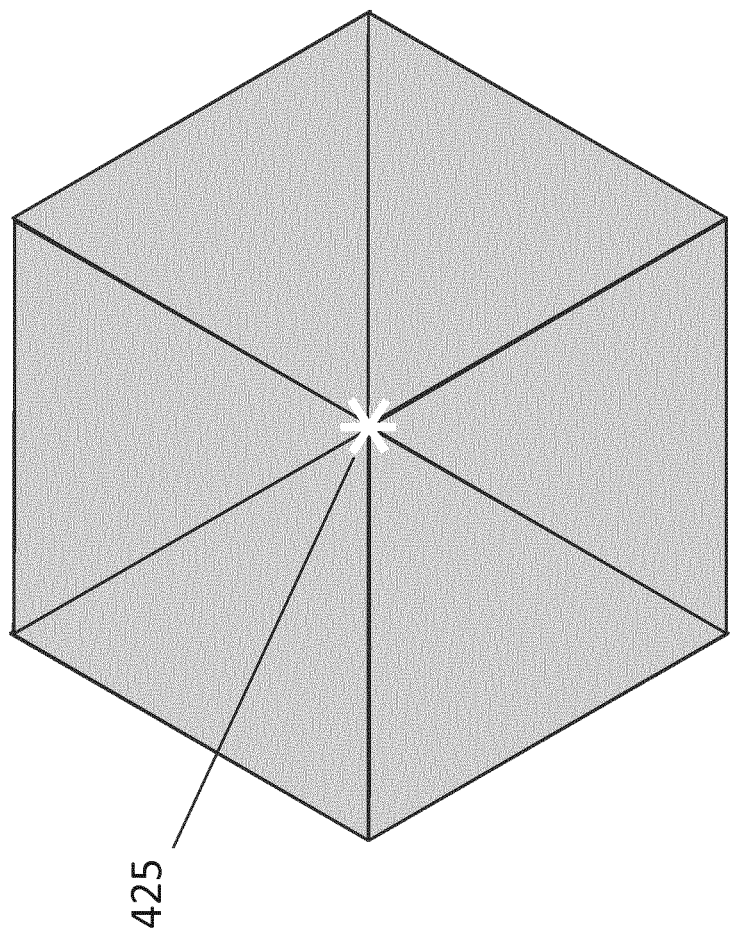
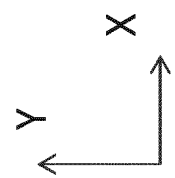
FIG. 12

PIXEL SHAPE AND SECTION SHAPE SELECTION FOR LARGE ACTIVE AREA HIGH SPEED DETECTOR

CROSS-REFERENCE TO RELATED APPLICATIONS

This application claims priority of U.S. application 62/660,765 which was filed on Apr. 20, 2018, and which is incorporated herein in its entirety by reference.

FIELD

The description herein relates to detectors, and more particularly, to switching detector arrays that may be applicable to charged particle detection.

BACKGROUND

Detectors can be used for sensing physically observable phenomena. For example, electron microscopes may comprise detectors that collect charged particles projected from a sample, and that output a detection signal. Detection signals can be used to reconstruct images of sample structures under inspection and may be used, for example, to reveal defects in the sample.

In some applications, an area detector may comprise a pixelated array of electron sensing elements that may detect one or more electron beams projected thereon. Detectors may include an active area in which electric current is generated in response to being hit with charged particles. In a pixelated array of electron sensing elements, there may be provided a grid of discrete detection elements that have separate active areas. Active areas may be surrounded by isolation areas to separate one pixel from neighboring pixels.

Detectors such as those discussed in U.S. Application No. 62/555,032 may be provided with switching regions between sensing elements. In such detectors, dead area may be reduced and detection performance may be enhanced. For example, isolation areas between the sides of adjacent sensing elements may be eliminated so that multiple sensing elements may be merged when covered by an electron beam spot.

In some detectors, however, the number of switching regions may depend on the shape of sensing elements. For example, a square shaped sensing element may be configured to be connected with adjacent sensing elements on each of its four sides. Thus, four switching regions may surround each sensing element.

SUMMARY

Embodiments of the present disclosure provide systems and methods for providing a detector. In some embodiments, a charged particle beam system is provided. The charged particle beam system may include a detector configured to detect charged particles generated in the charged particle beam system.

In some embodiments, a detector is provided that comprises a substrate including a plurality of sensing elements including a first sensing element, a second sensing element. The detector may include a switching region configured to connect the first sensing element and the second sensing element. The first sensing element may be configured to generate a first signal in response to the first sensing element detecting a beam, and the second sensing element may be configured to generate a second signal in response to the second sensing element detecting the beam. At least the first sensing element may be formed in a triangular shape. The triangular shape may be an equilateral triangle.

According to some embodiments, an arrangement may be achieved that reduces the number of switches between adjacent sensing elements and the number of control logics needed to control the switches. Additionally, the shape of sensing elements may enable sections of sensing elements to be formed in a corresponding shape. A section arrangement having a particular shape may reduce the total number of sections to be provided in a circuit die. Providing sensing elements in a triangular shape and sections in a hexagonal shape, for example, may improve detection system performance without causing loss in flexibilities of the detection system.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the disclosure. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as claimed.

BRIEF DESCRIPTION OF THE DRAWINGS

The above and other aspects of the present disclosure will become more apparent from the description of exemplary embodiments, taken in conjunction with the following drawings.

FIG. 6 is an enlarged view of a plurality of sensing elements, consistent with embodiments of the present disclosure.

FIG. 12 is an enlarged view of a plurality of sensing elements, consistent with embodiments of the present disclosure.

DETAILED DESCRIPTION OF THE DRAWINGS

Figure 1:
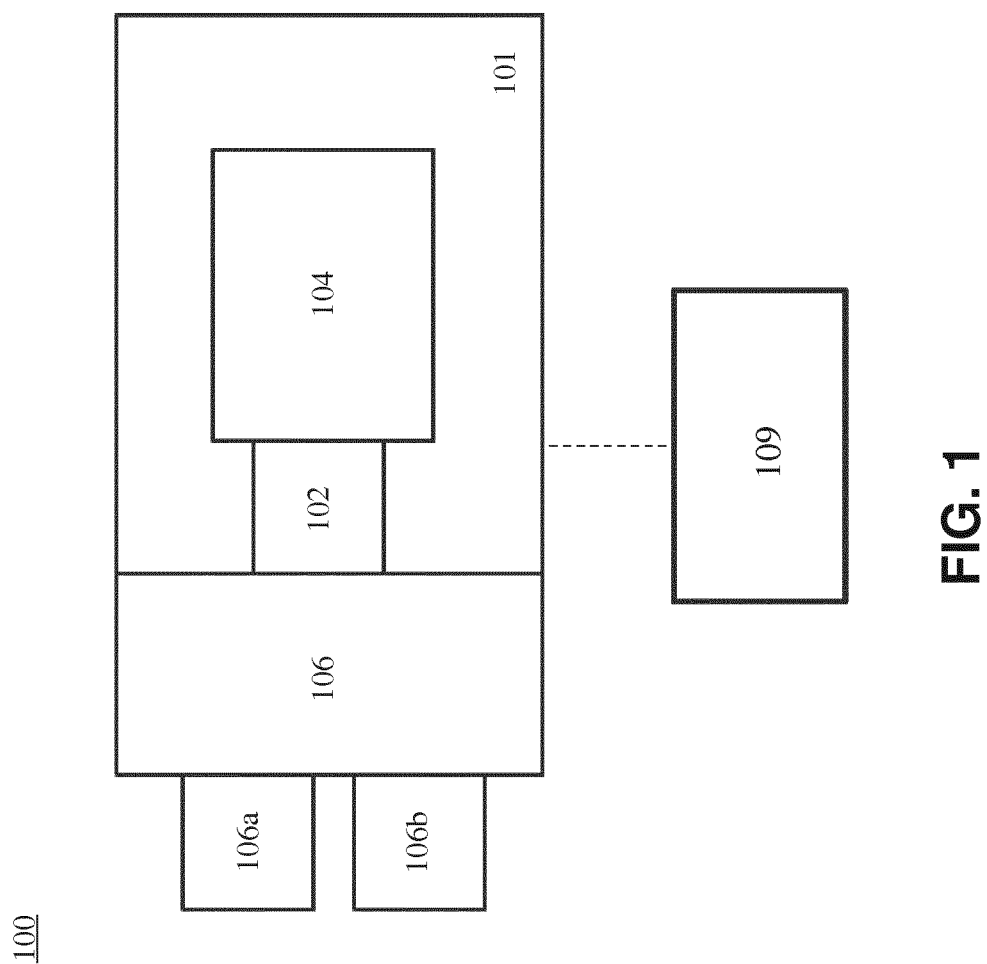
FIG. 1 is a schematic diagram illustrating an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to the subject matter as recited in the appended claims. For example, although some embodiments are described in the context of providing detectors in systems utilizing electron beams, the disclosure is not so limited. Other types of charged particle beams may be similarly applied. Furthermore, detectors may be used in other imaging systems, such as optical imaging, photo detection, x-ray detection, etc.

Embodiments of the present disclosure may provide a detector. The detector may have an array architecture. The detector may be used in a detection system that may be useful in, for example, a charged particle system for charged particle imaging. The charged particle system may be a scanning electron microscope (SEM) tool for imaging and inspecting a sample. The charged particle system may be used for defect detection, for example.

In some embodiments, an equilateral triangular shape is chosen for sensing elements (pixels) in a detector array. Under the condition that a detector array has the same amount of pixels, using a triangular shape rather than a rectangular shape may reduce the number of switches between adjacent pixels by 25%. For example, a triangle has 3 sides rather than 4 sides, and thus, three switches may be provided to connect a pixel rather than 4 switches. Reducing the number of switches may also reduce the amount of control logics connected to the switches by, for example, 25%. No other polygonal shape has a lower number of straight sides.

In some embodiments, a triangular pixel may be configured to have the same area as a corresponding rectangular pixel. Accordingly, the sides of the triangular pixel may be 52% longer than that of the rectangular pixel. This may result in a wider channel width for switching regions formed between two adjacent pixels. For example, a field programmable detector may be provided with switching regions formed as MOSFETs between adjacent pixels. Providing a wider channel may reduce the ON resistance of the MOSFET. Furthermore, higher bandwidth may be achieved in a detection system.

Furthermore, triangular pixels may form groups having a shape closer to that of an electron beam spot. For example, an electron beam spot may be projected on the surface of a detector in the shape of a circle or ellipse. Groups of triangular pixels may be better able to conform to the shape of the electron beam spot and may collect electron beam current with higher signal-to-noise ratio.

In some embodiments, a hexagonal shape is chosen for the active area of a detector array.

In some embodiments, a detector is provided with a plurality of sensing elements that are divided into sections. A first section may contain a first plurality of sensing elements, and a second section may contain a second plurality of sensing elements, and so on. The first plurality of sensing elements and the second plurality of sensing elements may be mutually exclusive. A hexagonal shape may be chosen for the sections. The sections may be uniform. Under the condition that the section shapes have the same diagonal size, the area of a hexagonal section may be 30% larger than that of a rectangular section. As a result, if the active area of the detector array is kept the same, a reduction in the number of section of, for example, 30% may be achieved. Accordingly, the number of sections and the number of signal paths may be reduced by using hexagonal sections.

A hexagonal shape may maximize the area of a group of pixels without any gaps between the shapes within the group.

Uniform sections and corresponding uniform signal paths may be more easily implemented in integrated circuits compared to non-uniform sections and non-uniform signal paths. Furthermore, some designs may have performance uniformity requirements for signal paths.

By combining pixels in the shape of equilateral triangles with hexagonal sections in a detector array, improved electron beam detection performance may be achieved. Other shapes of sections may be similarly applied. Furthermore, a circuit die may be simplified. Control logic for switching elements between adjacent pixels may also be simplified. Further still, a simplified digital multiplexer may be provided after an analog-to-digital converter (ADC) array. In addition, less signal paths may be required in a circuit die, which may reduce design and implementation difficulties. Thus, scaling up of designs may be made easier.

Reference is now made to FIG. 1, which illustrates an exemplary electron beam inspection (EBI) system 100 that may include a detector consistent with embodiments of the present disclosure. EBI system 100 may be used for imaging. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be part of the structure.

Figure 2:
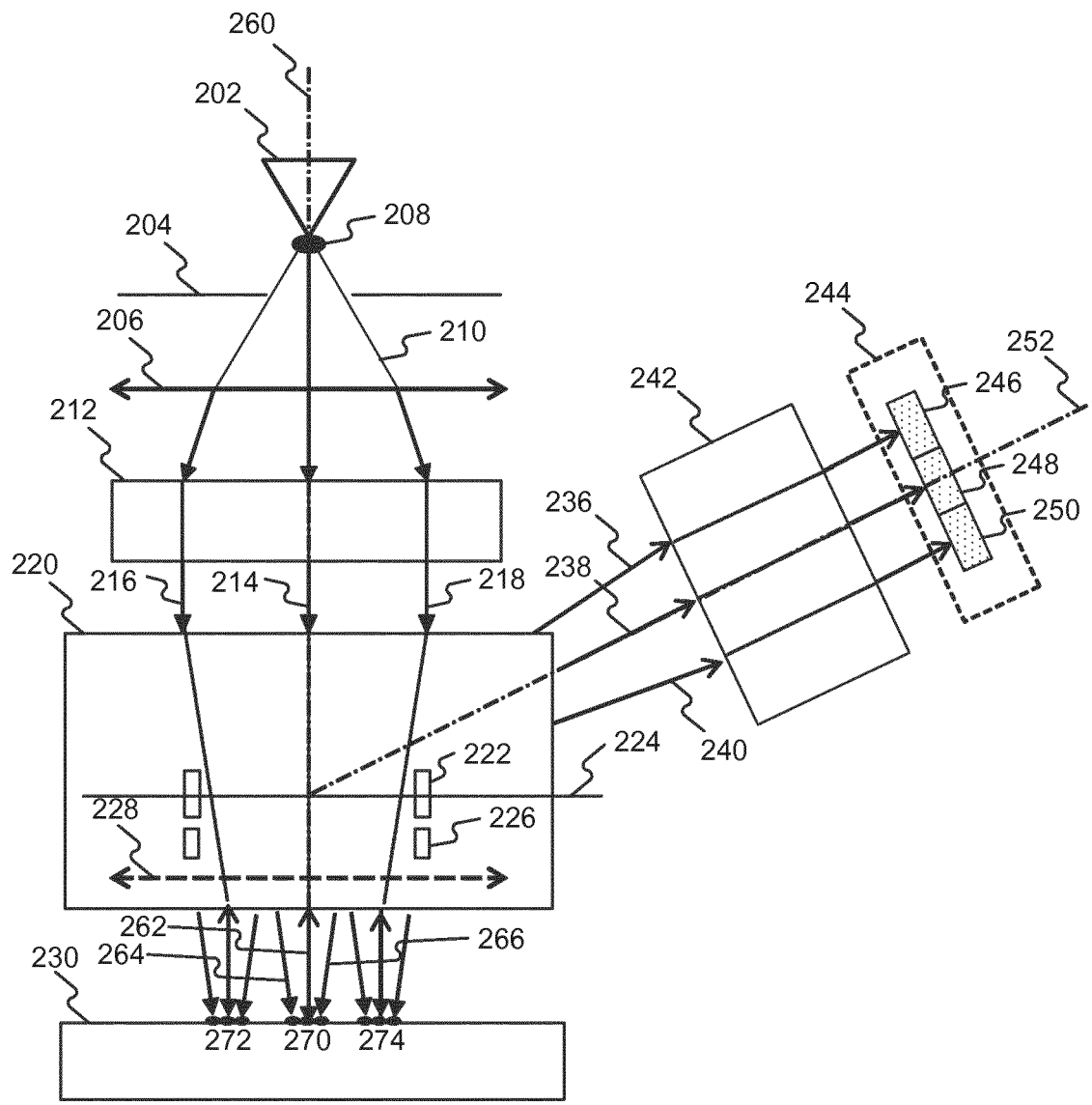
FIG. 2 is a schematic diagram illustrating an exemplary electron beam tool, consistent with embodiments of the present disclosure that may be a part of the exemplary electron beam inspection system of FIG. 1.

Reference is now made to FIG. 2, which illustrates an electron beam tool 104 (also referred to herein as apparatus 104) comprising an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2), multiple secondary electron beams 236, 238, and 240, a secondary optical system 242, and an electron detection device 244. Primary projection optical system 220 may comprise a beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 104. Secondary optical system 242 and electron detection device 244 may be aligned with a secondary optical axis 252 of apparatus 104.

Electron source 202 may comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 may block off peripheral electrons of primary electron beam 210 to reduce size of probe spots 270, 272, and 274.

Source conversion unit 212 may comprise an array of image-forming elements (not shown in FIG. 2) and an array of beam-limit apertures (not shown in FIG. 2). The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 210. The array of beam-limit apertures may limit the plurality of beamlets 214, 216, and 218.

Condenser lens 206 may focus primary electron beam 210. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Objective lens 228 may focus beamlets 214, 216, and 218 onto a wafer 230 for inspection and may form a plurality of probe spots 270, 272, and 274 on the surface of wafer 230. Condenser lens 206 may be a moveable condenser lens that may be configured so that the position of its first principle plane is movable. The movable condenser lens may be configured to be magnetic, which may result in off-axis beamlets 216 and 218 landing on the beamlet-limit apertures with rotation angles. The rotation angles change with the focusing power and the position of the first principal plane of the movable condenser lens. In some embodiments, the moveable condenser lens may be a moveable anti-rotation condenser lens, which involves an anti-rotation lens with a movable first principal plane. Moveable condenser lens is further described in International Application No. PCT/EP2017/084429, which is incorporated by reference in its entirety.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field. Beamlets 214, 216, and 218 may therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 towards secondary optical system 242.

Deflection scanning unit 226 may deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 242 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Figure 3:
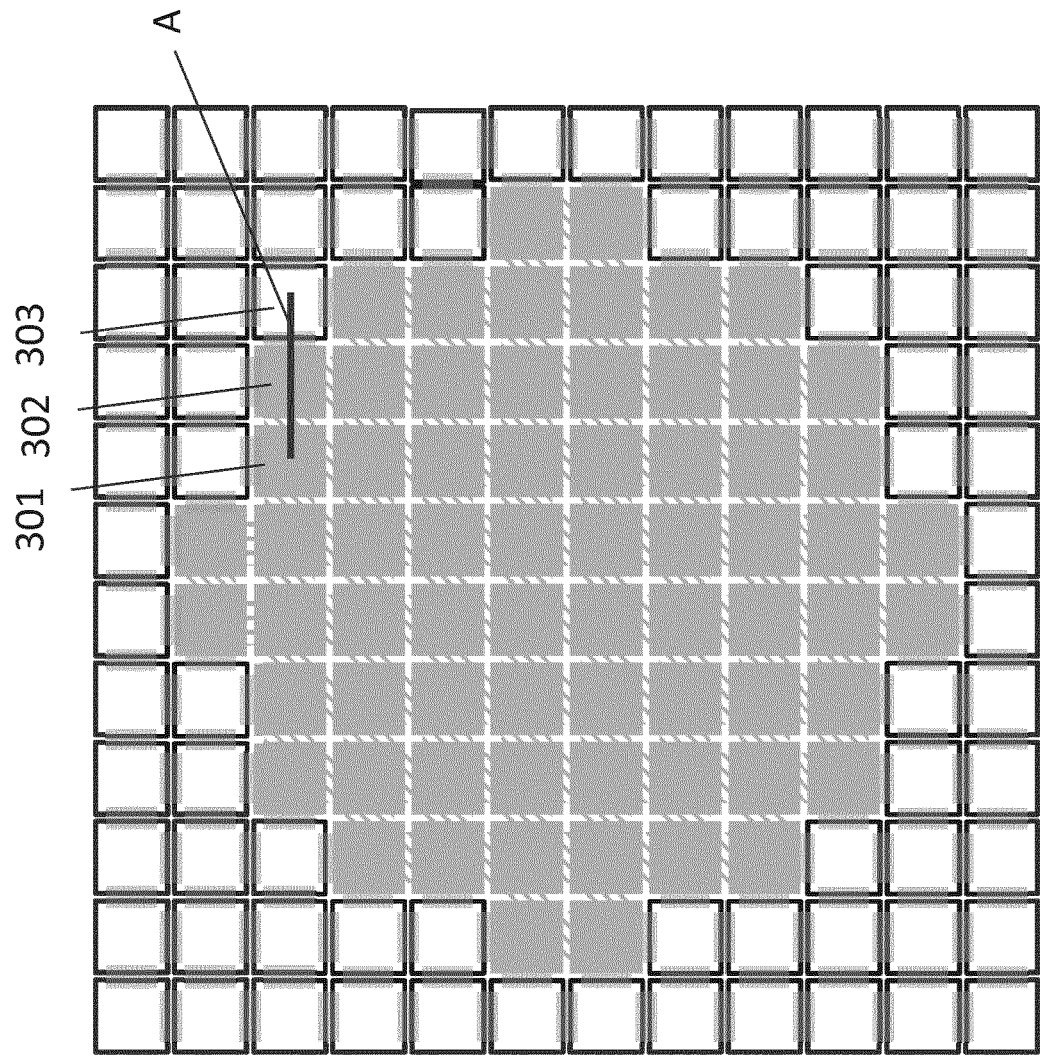
FIG. 3 is a schematic representation of an exemplary structure of a detector, consistent with embodiments of the present disclosure.

Reference is now made to FIG. 3, which illustrates an exemplary structure of a sensor surface 300 that may form a surface of electron detection device 244. Sensor surface 300 has an array structure comprising a plurality of sensing elements, including sensing elements 301, 302, 303, and so on, each capable of receiving at least a part of a beam spot. Sensing elements 301, 302, 303 may be configured to generate an electrical signal in response to receiving energy. While one array is shown in FIG. 3, it is appreciated that detector may include multiple arrays, such as one array for each secondary electron beam.

The sensing elements may comprise, for example, a PIN diode, avalanche diode, electron multiplier tube (EMT), and the like, and combinations thereof. For example, sensing elements 301, 302, 303 may be electron sensing elements. Electron sensing elements may generate a current signal commensurate with the electrons received in the sensor active area. A processing circuit may convert the generated current signal into a voltage signal (representing the intensity of the received electron beam spot). A processing system may generate an intensity signal of the electron beam spot by, for example, summing the currents generated by the electron sensing elements located within a sensor region, correlate the intensity signal with scan path data of the primary electron beam incident on the wafer, and construct an image of the wafer based on the correlation.

While electron sensing elements are described above as receiving electrons from an electron beam, in the case of other types of detectors, a sensor may be configured to generate a signal in response to receiving other types of irradiation. For example, a detector may react to charged particles having a particular charge. Also, a detector may be sensitive to flux, spatial distribution, spectrum, or other measurable properties. Thus, a sensing element of a detector may be configured to generate a signal in response to receiving a certain type or level of energy, for example, electrons or ions having a predetermined amount of energy.

A detector may be provided with one or a plurality of substrates, such as dies. For example, there may be a sensor die and a circuit die. The dies may be stacked in a thickness direction of the detector. For example, a detector may be formed as a substantially planar member having sensing elements arrayed in a two-dimensional plane. The sensor die may comprise sensing elements (including sensing elements 301, 302, 303), and the circuit die may comprise signal processing circuitries. The sensor die and the circuit die may be stacked together with each other in a stacking direction orthogonal to the plane of the array of sensing elements.

Figure 4:
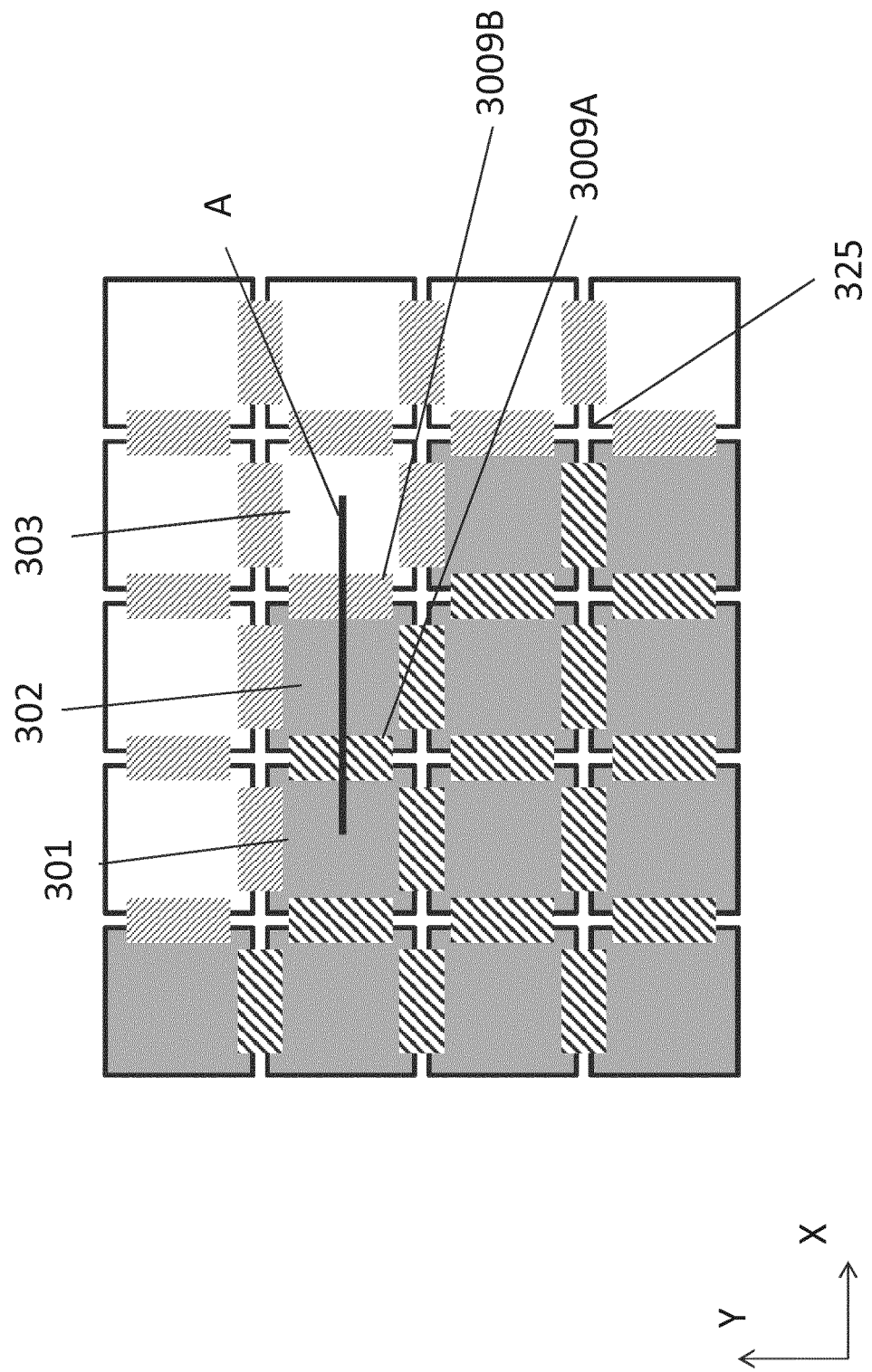
FIG. 4 is an enlargement of a section of FIG. 3.
Figure 5:
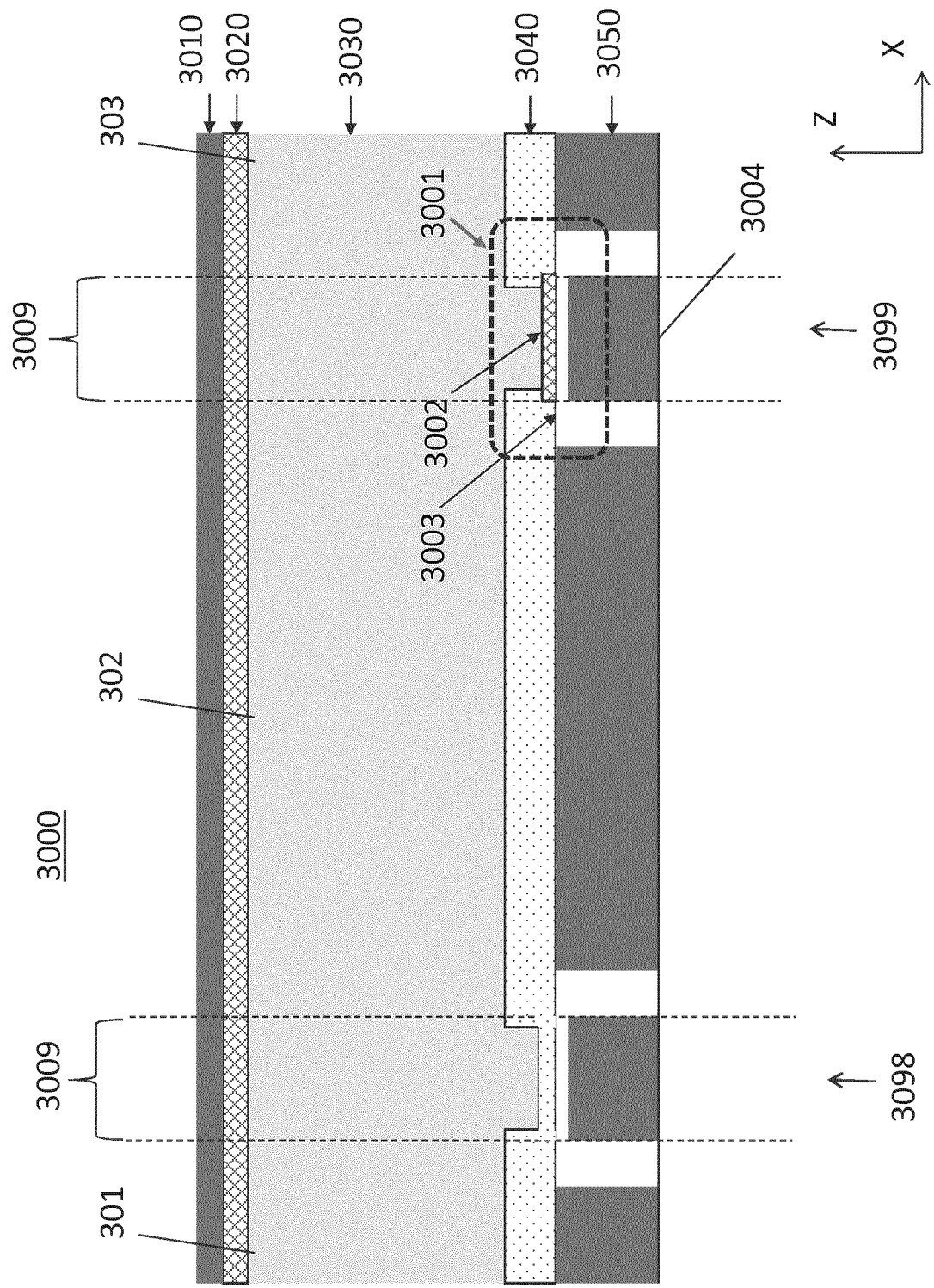
FIG. 5 is a diagram illustrating a cross sectional view of a detector, consistent with embodiments of the present disclosure.

FIG. 4 illustrates an enlarged portion of a region shown in FIG. 3. FIG. 5 shows an exemplary structure of sensor elements taken along a cross section in the thickness direction of the detector array of the portion A indicated in FIG. 3 and FIG. 4.

As illustrated in FIG. 5, sensing elements 301, 302, 303 may be configured as a PIN diode device 3000. PIN diode device 3000 may comprise a metal layer 3010 as a top layer. Metal layer 3010 is a layer for receiving electrons incident on the electron detection device 244. Thus, metal layer 3010 is configured as a detection surface. A material of metal layer 3010 may be aluminum, for example. When aluminum is used in metal layer 3010, an oxidized layer may be formed on the exterior of the surface so as to protect electron detection device 244. PIN diode device 3000 may also comprise metal layer 3050 as a bottom layer. A material of metal layer 3050 may be copper, for example. Metal layer 3050 may comprise output lines for carrying induced current from each of the sensing elements 301, 302, 303.

PIN diode device 3000 may include a semiconductor device. For example, a semiconductor device constituting a PIN diode device may be manufactured as a substrate with a plurality of layers. Thus, sensing elements 301, 302, 303 may be contiguous in cross-sectional view. Switching regions 3009 may be integral with the sensing elements. Additionally, sensing elements 301, 302, 303, and/or switching regions 3009 may be configured as a plurality of discrete semiconductor devices. The discrete semiconductor devices may be configured to be directly adjacent to each other. Thus, even when sensing elements are configured to be discrete, a fixed isolation area may be eliminated and dead area may be reduced.

In operation of PIN diode device 3000, a p+ region 3020 is formed adjacent to metal layer 3010. P+ region 3020 may be a p-type semiconductor layer. An intrinsic region 3030 is formed adjacent to p+ region 3020. Intrinsic region 3030 may be an intrinsic semiconductor layer, and thus, may be a charge carrier region. An n+ region 3040 is formed adjacent to intrinsic region 3030. N+ region 3040 may be an n-type semiconductor layer. A sensor layer of electron detection device 244 may be formed as the layers of metal layer 3010, p+ region 3020, intrinsic region 3030, n+ region 3040, and metal layer 3050.

PIN diode device 3000 comprises a switching region 3009 formed between two adjacent sensing elements. As shown in FIG. 5, a switching region 3009 is formed between sensing elements 301 and 302, and another switching region 3009 is formed between sensing elements 302 and 303. A switch may be formed in switching region 3009. As an example, an enhancement mode MOSFET 3001 may be formed in the sensor layer of PIN diode device 3000 at switching region 3009.

MOSFET 3001 may comprise a p+ region 3002, gate 3004, and gate oxide 3003. MOSFET 3001 is configured as a "normally open" type switch. In ON mode, voltage applied to gate 3004 increases conductivity of the device. Thus, without activating MOSFET 3001, the switch between sensing elements 302 and 303 is OFF and sensing elements 302 and 303 are thereby not connected through MOSFET 3001. By activating MOSFET 3001, the switch between sensing elements is turned ON and sensing elements 301 and 302 are connected through MOSFET 3001. For example, PIN diode device 3000 may be configured with MOSFETs operable in a turn ON state 3098 and a turn OFF state 3099. MOSFET 3001 may be controlled through gate 3004.

A process of fabricating a MOSFET, such as MOSFET 3001, may comprise etching and material deposition, for example, among other techniques.

In operation, when electrons are incident on the top surface of metal layer 3010, intrinsic region 3030 is flooded with charge carriers from p+ region 3020. As can be seen in FIG. 5, when two adjacent sensing elements, for example 301 and 302 are connected, all area under the metal layer 3010 in the region irradiated will be activated, including the area in switching region 3009. Thus, two adjacent sensing elements can be grouped together (merged) for collecting current in response to incident electrons, while dead area between adjacent sensing elements may be eliminated. An isolation area need not be provided to separate adjacent sensing elements, for example 301 and 302, in cross-sectional view. Thus, sensing elements 301 and 302 may be made contiguous.

As seen in the plan view of FIG. 4, switching region 3009A between sensing elements 301 and 302 is an activate area used for sensing. Switching region 3009B between an active sensing element 302 and an inactive sensing element 303, meanwhile, is not an active area used for sensing. Switching regions 3009 may span substantially a whole length of respective sensing elements. For example, a sensing element may have a rectangular shape extending in a first direction X and a second direction Y. The rectangular shaped sensing element may have a first side extending in the first direction and a second side extending in the second direction. A switching region 3009 may extend an entire length of the first side. Another switching region 3009 may extend an entire length of the second side. Additionally, switching regions may extend a length shorter than the first or second sides. The switching regions may be directly adjacent to the sensing element such that an active area may be made contiguous.

FIG. 6 shows an example of where switching regions span substantially a whole length of respective sensing elements. Sensing element 601 has a square shape extending in a first direction (X-axis direction) and a second direction (Y-axis direction). Region 610 spans substantially a whole length of the side in the first direction, and region 620 spans substantially a whole length of the side in the second direction.

It should be appreciated that PIN diodes may be realized in various configurations employing different arrangements of p- and n-type semiconductors.

As shown in FIG. 4, a cross shaped area 325 may be provided. Area 325 may be an isolation area to isolate the corners of pixels from pixels that are across from one another in diagonal directions. Various shapes may be used instead of a cross. For example, area 325 may be provided as a square, a polygon, a circle, etc. Area 325 may also comprise diagonal line sections, so as to separate diagonal pixels with as small an area as possible.

Figure 7:
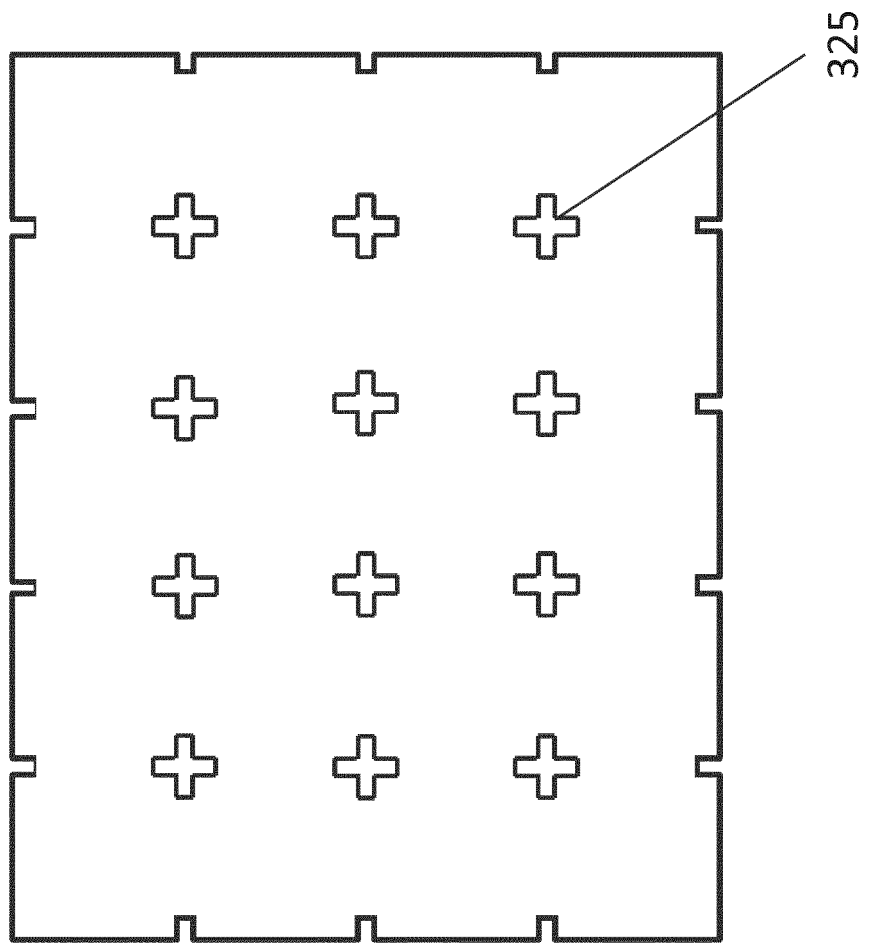
FIG. 7 is a view of a rear surface of a detector, consistent with embodiments of the present disclosure.

FIG. 7 shows a section of a surface of a detector from a back side, opposite to an incidence side. Some components, such as gates and other elements of transistors, are omitted for clarity. The surface may be constituted by metal layer 3050. Area 325 may be a cross shaped area, as discussed above. Area 325 may be formed of a material that is an electrical insulator. Thus, short circuits between adjacent sensing elements may be prevented.

Figure 8:
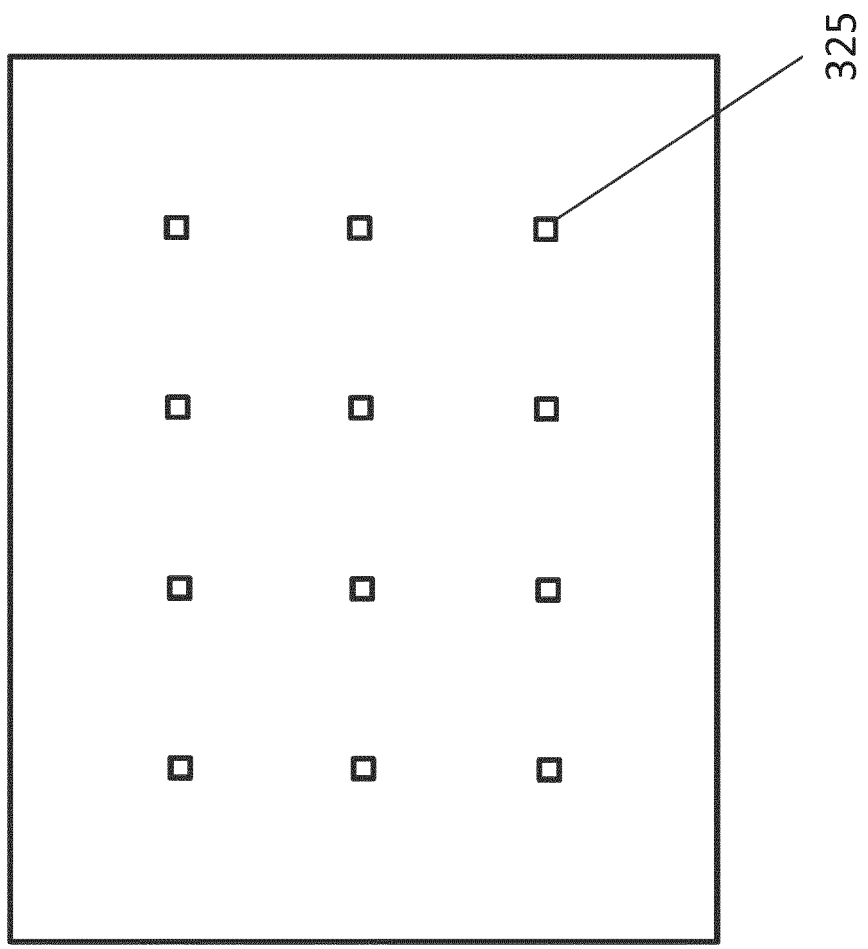
FIG. 8 is a further view of a rear surface of a detector, consistent with embodiments of the present disclosure.

FIG. 8 illustrates a view where area 325 is provided as a square shaped area. Area 325 may be provided in a square shape when, for example, when switching regions span substantially the whole length of the sides of respective sensing elements.

In the examples discussed above, sensing elements are provided as square- or rectangular-shaped pixels. However, in some embodiments of the present disclosure, sensing elements may be provided in a triangular shape.

Figure 9:
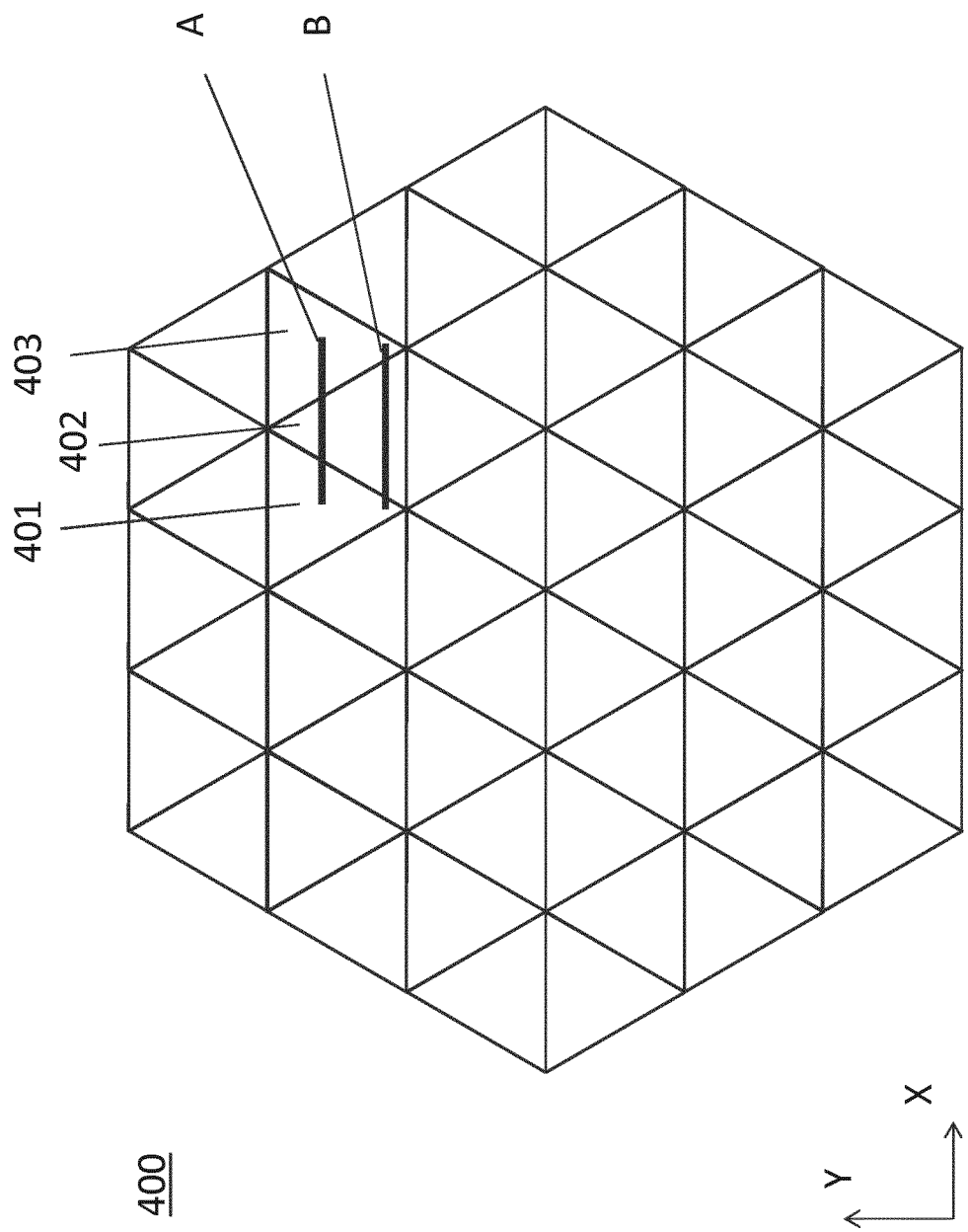
FIG. 9 is a schematic representation of an exemplary structure of a detector, consistent with embodiments of the present disclosure.

FIG. 9 illustrates an exemplary structure of a sensor surface 400 that may form a surface of electron detection device 244. Sensor surface 400 has an array structure comprising a plurality of sensing elements, including sensing elements 401, 402, 403, and so on, each capable of receiving at least a part of a beam spot.

The sensing elements may comprise, for example, a PIN diode, avalanche diode, electron multiplier tube (EMT), and the like, and combinations thereof. For example, sensing elements 401, 402, 403 may be electron sensing elements.

Figure 10A:
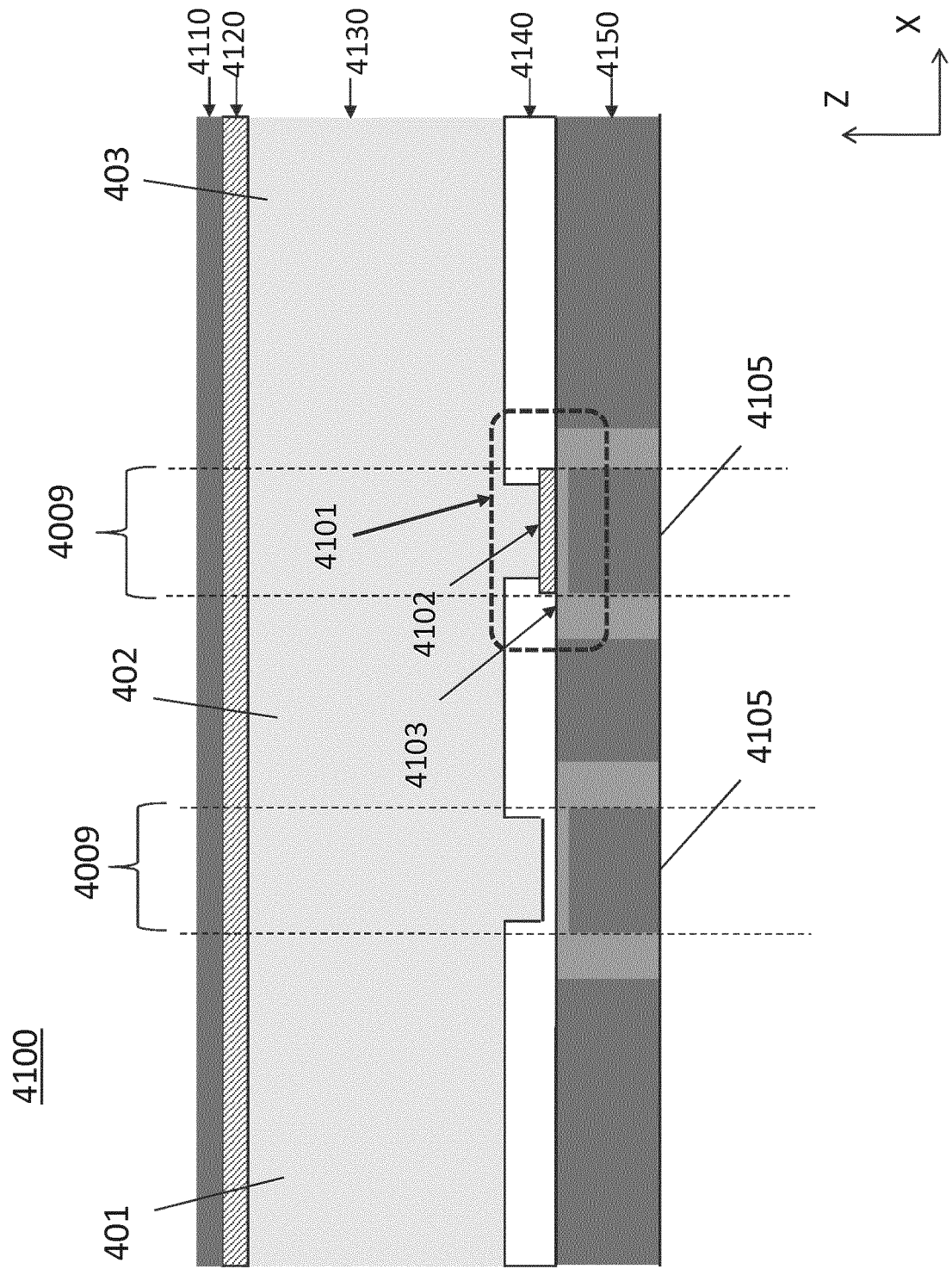
FIG. 10A is a diagram illustrating a cross sectional view of the detector of FIG. 9 taken along the portion A, consistent with embodiments of the present disclosure.

As illustrated in FIG. 10A, sensing elements 401, 402, 403 may be configured as a PIN diode device 4100. PIN diode device 4100 may comprise a metal layer 4110 as a top layer. Metal layer 4110 may be a layer for receiving electrons incident on the electron detection device 244, and thus, metal layer 4110 may be configured as a detection surface. A material of metal layer 4110 may be aluminum, for example. PIN diode device 4100 may also comprise metal layer 4150 as a bottom layer. A material of metal layer 4150 may be copper, for example. Metal layer 4150 may comprise output lines for carrying induced current from each of the sensing elements 401, 402, 403.

PIN diode device 4100 may include a semiconductor device. For example, a semiconductor device constituting a PIN diode device may be manufactured as a substrate with a plurality of layers. Thus, sensing elements 401, 402, 403 may be contiguous in cross-sectional view. Switching regions 4009 may be integral with the sensing elements. Additionally, sensing elements 401, 402, 403, and/or switching regions 4009 may be configured as a plurality of discrete semiconductor devices. The discrete semiconductor devices may be configured to be directly adjacent each other. Thus, even when sensing elements are configured to be discrete, a fixed isolation area may be eliminated and dead area may be reduced.

PIN diode device 4100 may function similarly to PIN diode device 3000, as described above. Thus, there may be provided a p+ region 4120, an intrinsic region 4130, and an n+ region 4140. Additionally, PIN diode device 4100 comprises a switching region 4009 formed between two adjacent sensing elements.

Figure 10B:
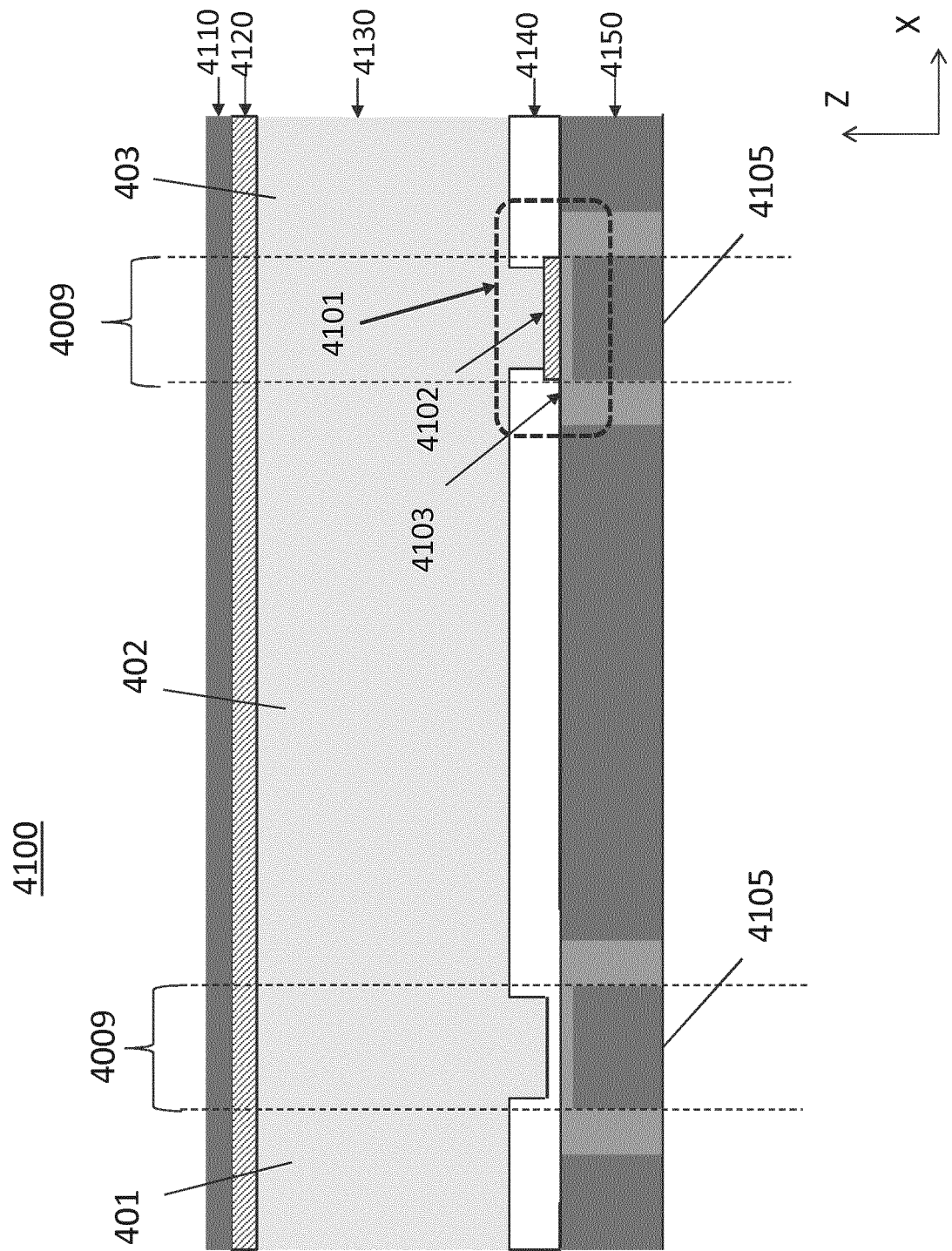
FIG. 10B is a diagram illustrating a cross sectional view of the detector of FIG. 9 taken along the portion B, consistent with embodiments of the present disclosure.

FIG. 10A shows an exemplary structure of sensor elements taken along a cross-section in the thickness direction of the detector array of the portion A indicated in FIG. 9, and FIG. 10B shows an exemplary structure of sensor elements taken along a cross-section in the thickness direction of the detector array of the portion B indicated in FIG. 9. As shown in FIG. 10A, switching regions 4009 are closer together than they are in FIG. 10B due to the triangular shape of sensing elements.

As shown in FIG. 10A, switching region 4009 is formed between sensing elements 401 and 402, and another switching region 4009 is formed between sensing elements 402 and 403. A switch may be formed in the switching region 4009. As an example, an enhancement mode MOSFET 4001 may be formed in the sensor layer of PIN diode device 4000 at switching region 4009. MOSFET 4001 may be controlled through gate 4105.

Switching region 4009 may be formed between adjacent sensing elements in a horizontal direction. For example, a switching region 4009 is between sensing element 401 and sensing element 402 in an X-direction that is perpendicular to a Z direction (the thickness direction of the substrate).

Figure 11:
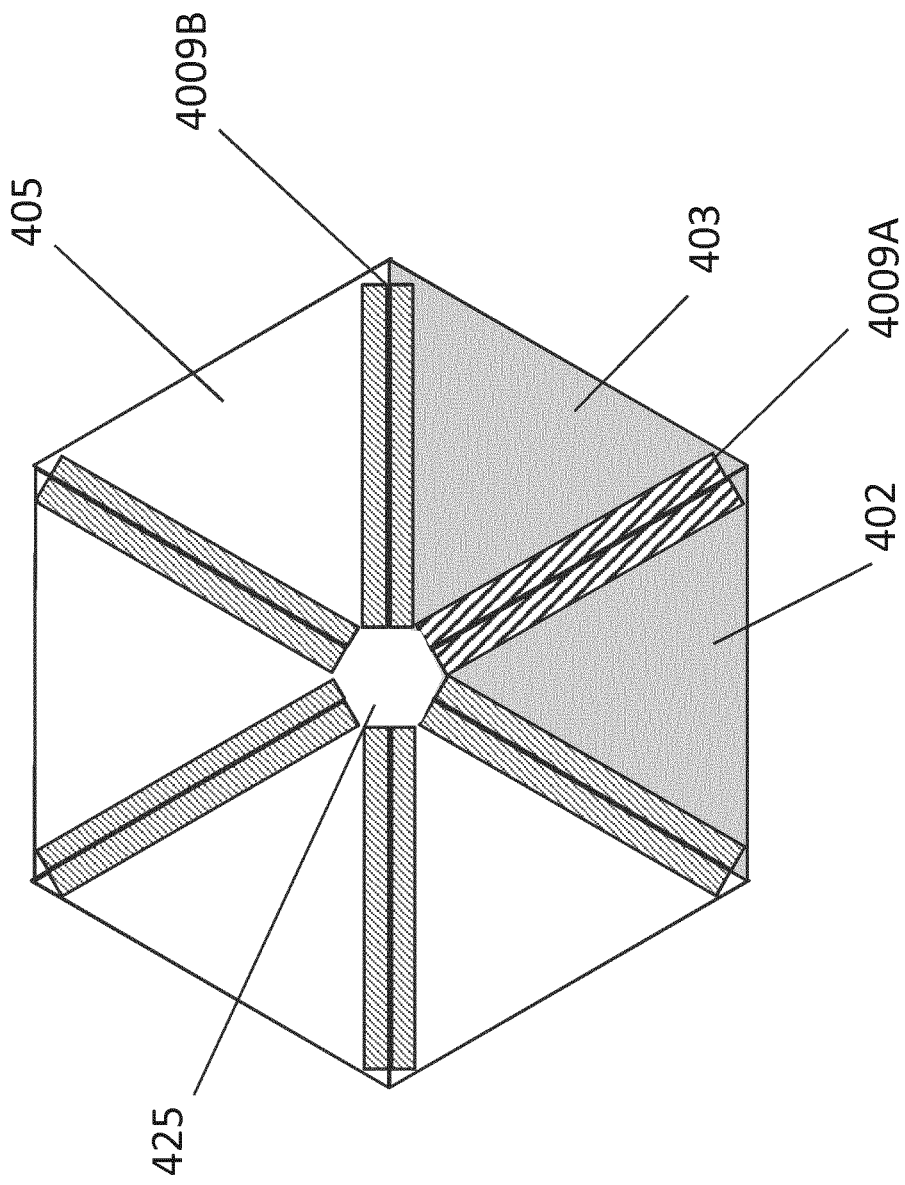
FIG. 11 is an enlarged view of a plurality of sensing elements, consistent with embodiments of the present disclosure.

FIG. 11 shows an enlarged view of multiple triangular-shaped sensing elements. As shown in FIG. 11, when two adjacent sensing elements, for example 402 and 403 are connected, all of the area under the metal layer 4010 in the region irradiated will be activated, including the area in switching region 4009A. Thus, two adjacent sensing elements can be grouped together (merged) for collecting current in response to incident charged particles, while dead area between adjacent sensing elements may be eliminated. An isolation area need not be provided to separate the sides of adjacent sensing elements, for example 402 and 403, in cross-sectional view.

Switching region 4009A between sensing elements 402 and 403 is an activate area used for sensing. Switching region 4009B between an active sensing element 403 and an inactive sensing element 405, meanwhile, is not an active area used for sensing. Switching regions 4009 may span substantially a whole side length of respective sensing elements.

Compared to a square sensing element having the same area, a triangular sensing element may be geometrically configured so that the sides of the triangle are up to 52% longer than that of the square. For example, area of a square sensing element may be given by $A=s^2$ where s is side length. Area of an equilateral triangle may be given by $A=(\sqrt{3}/4)b^2$ where b is side length. Thus, when area is set to be equal, the ratio b:s is 1.52. When the length of the straight sides between adjacent sensing elements may be made longer, the length of switching regions, such as switching region 4009, may be made longer. Accordingly, channel width of, for example, MOSFET 4101 that forms a switch may be made larger, and ON resistance of the MOSFET may be reduced.

In some embodiments, switching regions 4009 may extend substantially an entire length of a side of a sensing element. Furthermore, switching regions 4009 may extend less than an entire length of the side of the sensing element. For example, an area 425 may be provided that is an isolation area. Area 425 may be formed of a material that is an electrical insulator. Accordingly, short circuits between adjacent sensing elements may be prevented. Area 425 may be provided to ensure that gates of adjacent switching regions 4009 are not touching. Thus, various shapes of area 425 may be used.

For example, area 425 may be formed with a hexagonal shape, as in FIG. 11. In some embodiments, area 425 may be formed with a star shape. For example, area 425 may comprise a plurality of lines of a predetermined thickness, resembling an asterisk, as shown in FIG. 12. The predetermined thickness may be based on parameters such as desired level of EM shielding, dielectric breakdown, etc. In some embodiments, switching regions 4009 may be formed with tapering edges toward vertexes so that area 425 may be minimized.

In some embodiments, a switching region may be disposed in the active area of sensing elements. In other embodiments, the switching region may also be formed outside the active area of the sensing elements.

Figure 13:
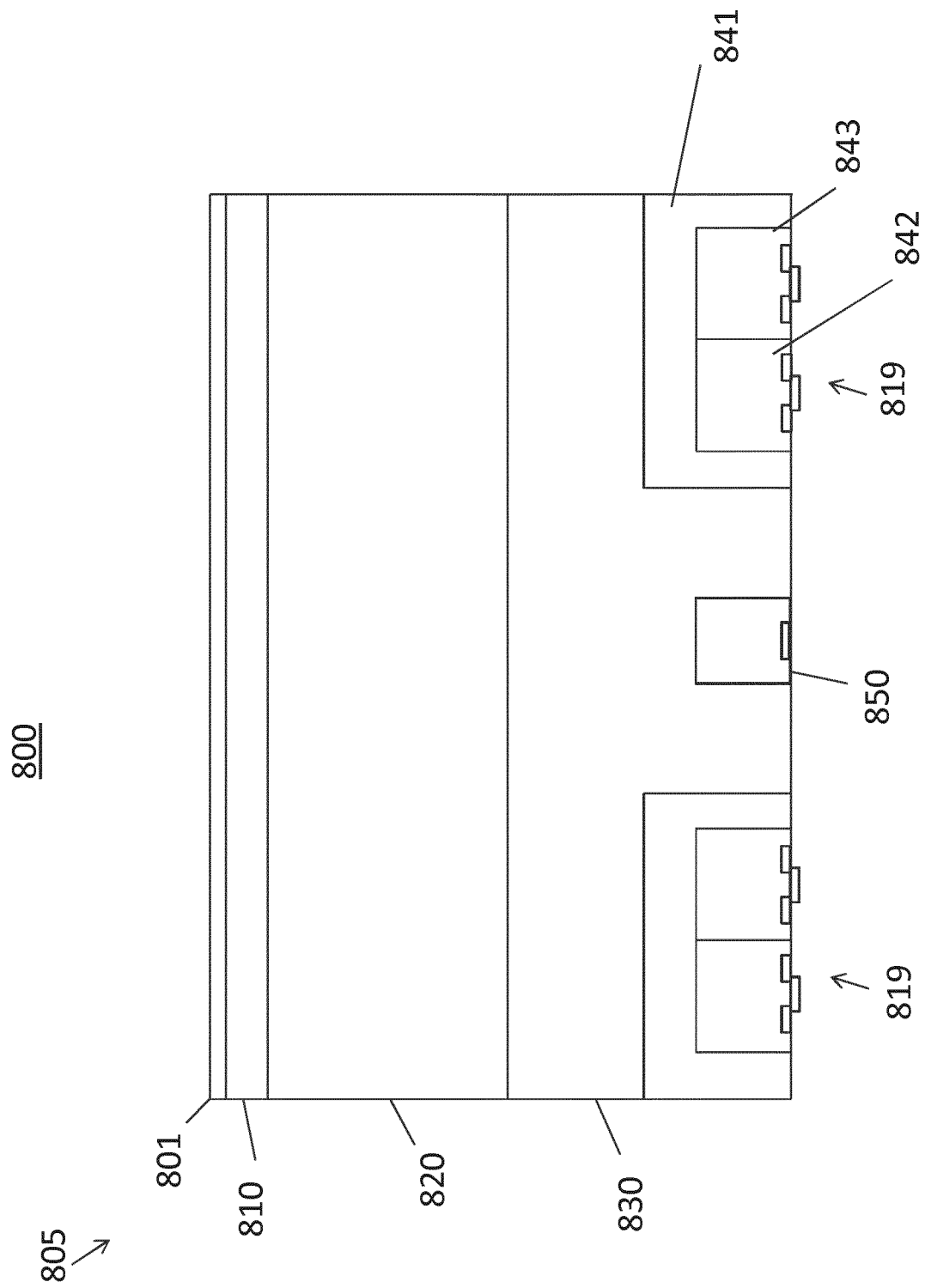
FIG. 13 is a diagram illustrating a cross sectional view of a sensing element, consistent with embodiments of the present disclosure.

For example, in some embodiments, a sensor layer of a detector may contain wells, trenches, or other structures, wherein the switching regions are formed in those structures. FIG. 13 is a cross-sectional view of a sensing element 800 with a built-in p-well and n-well for forming switches and other active and/or passive elements. Such elements may connect to sensing element 800 or other components. Sensing element 800 may form part of a sensor layer 805 that may be a sensor layer of a detector array, while a circuit layer and other layers are not shown in FIG. 13.

Sensing element 800 may comprise a diode device having a surface layer 801, a p+ region 810, a p-epitaxial region 820, an n− region 830, among others. Surface layer 801 may form a detection surface of a detector that receives incident electrons. Surface layer 801 may be a metal layer formed by aluminum, for example. On an opposite side from surface layer 801, there may be provided an electrode 850 as a charge collector. Electrode 850 may be configured to output a current signal representing the amount of electrons received in the activated area of sensing element 800.

Switching elements 819 may be formed by metal oxide semiconductor devices. For example, a plurality of CMOS devices may be formed in a back side of sensor layer 805. As an example of a CMOS device, there may be provided a deep p-well 841, an n-well 842, and a p-well 843. A process of fabricating CMOS devices may comprise etching and patterning, for example, among other techniques.

Although only one sensing element 800 is shown, it will be understood that sensor layer 805 may be made up of a plurality of sensing elements. The sensing elements may be contiguous in cross-sectional view.

Figure 14:
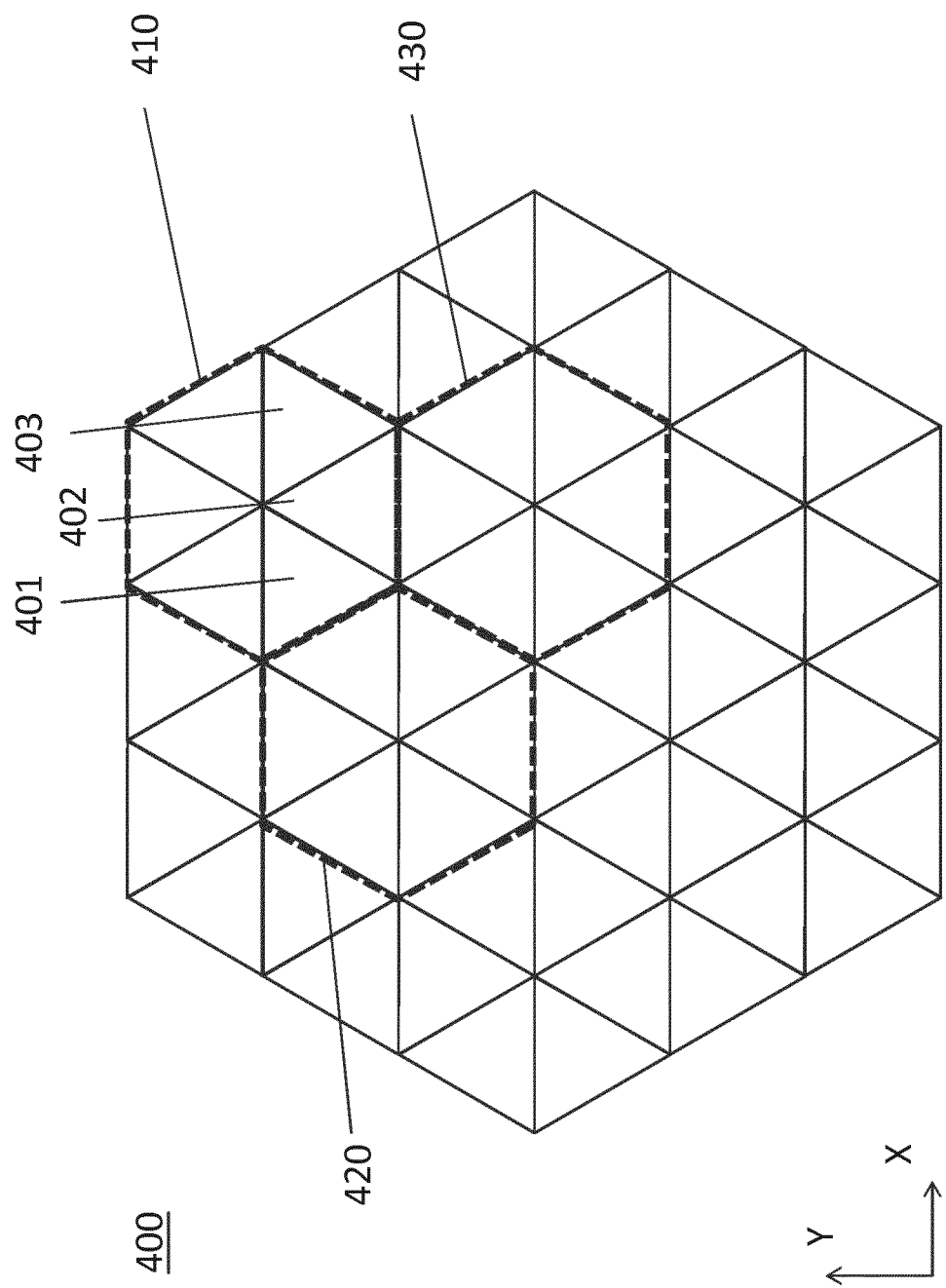
FIG. 14 is a schematic representation of an exemplary structure of a detector, consistent with embodiments of the present disclosure.
Figure 15:
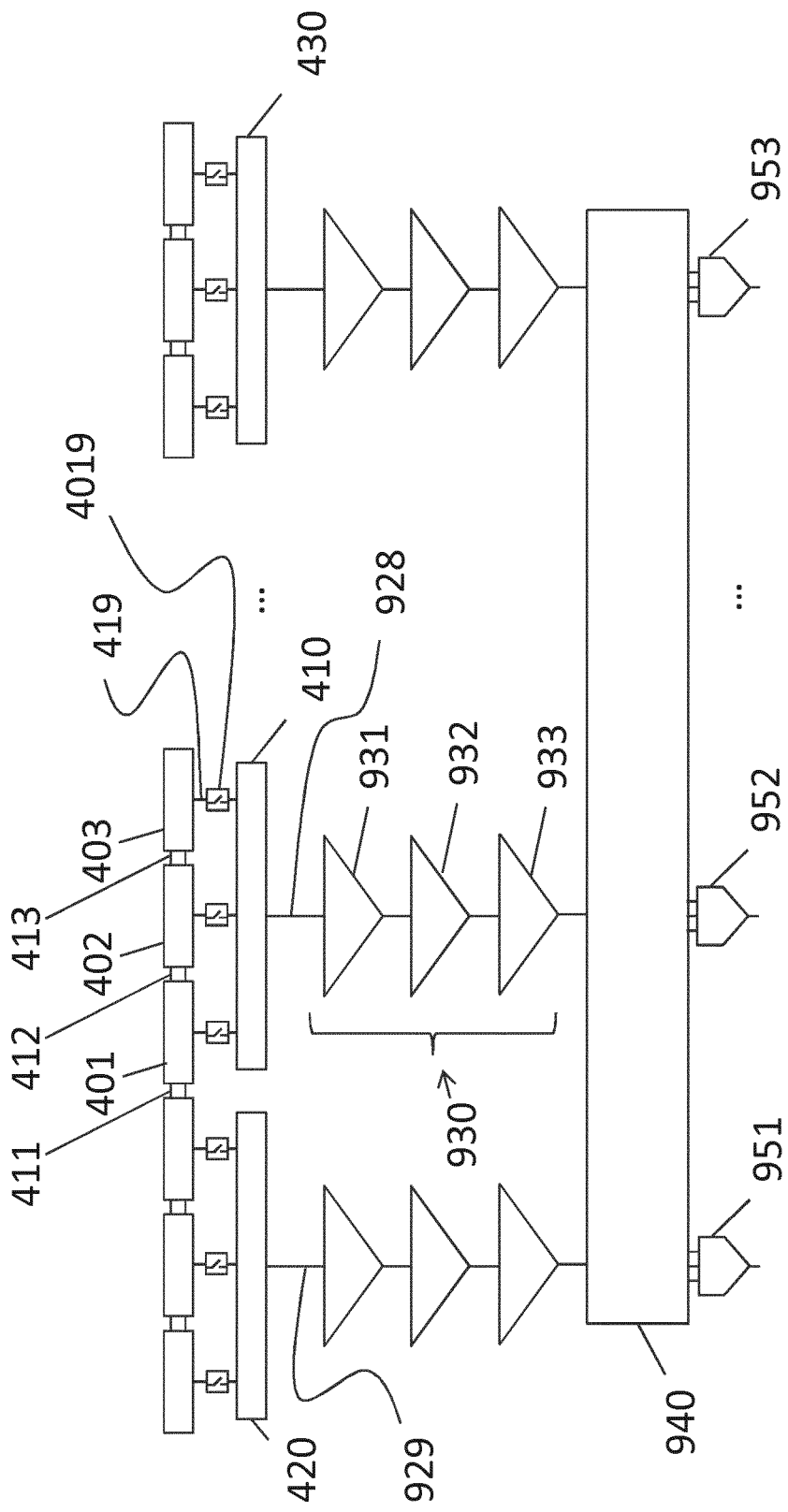
FIG. 15 is a diagram representing a structure of a detector, consistent with embodiments of the present disclosure.

Reference is now made to FIG. 14 and FIG. 15 with regard to a section arrangement consistent with aspects of the present disclosure. A plurality of sections may be provided, such as sections 410, 420, and 430. Sections may be configured to electrically connect one or more sensing elements of a plurality of sensing elements. Sections may be configured to output a common output. A first section may connect one or more sensing elements of a first plurality of sensing elements among the plurality of sensing elements to an output. A second section may connect one or more sensing elements of a second plurality of sensing elements to an output. For example, as shown in FIG. 15, section 410 may be electrically connected to sensing elements 401, 402, and 403, and connected to a first output 928. Section 420 may be electrically connected to other sensing elements, and may be connected to a second output 929. The sections may connect to the sensing elements via a plurality of wiring paths 419. The sections may be configured to output electrical signals to signal processing circuitries. For example, section 410 may output electrical signals to signal processing circuitry 930.

Signal processing circuitry 930 may include one or more signal processing circuitries for processing output of the connected sensing elements. For example, signal processing circuitry 930 may comprise a pre-amplifier, such as a transimpedance amplifier (TIA) or a charge transfer amplifier (CTA), a post-amplifier 932, such as a variable gain amplifier (VGA), and a data converter 933, such as an analog-to-digital converter (ADC). One or more of the above components may be omitted. Additionally, other circuitries may also be provided for other functions. For example, switch actuating circuitries may be provided that may control switching elements for connecting sensing elements to one another, or other switches. Furthermore, in some embodiments, an analog output line may be provided that may be read by an analog path, in addition to or instead of being sent to the ADC.

An interface such as a digital switch 940 may be provided. Digital switch 940 may connect first output 928 and second output 929. Digital switch 940 may comprise a multiplexer. For example, a multiplexer may be configured to receive a first number of inputs and generate a second number of outputs. The first number and the second number may correspond with parameters of the detector, such as total number of sensing element sections, and with parameters of apparatus 104, such as number of beam (or beamlets) generated from electron source 202. Digital switch 940 may communicate with external components via data line and address signals. Digital switch 940 may also control data read/write. Digital switch 940 may also be configured to control manipulation of switching elements. Digital switch 940 may be configured to generate output signals via a plurality of output paths 951, 952, 953, and so on. Other components, such as relays, etc., may be connected to output channels of the digital switch 940. Thus, the plurality of sections may act as separate data highways for detector signals.

It will be understood that various components may be inserted at various stages in the representation of FIG. 15. Furthermore, a sensor layer made up of a plurality of sensing elements, including sensing elements 401, 402, and 403, may comprise switching regions, such as switching elements 411, 412, and 413. Switching elements 411, 412, and 413 are provided between adjacent sensing elements and are configured to connect adjacent sending elements. Switching elements 411, 412, and 413 may correspond to switching element 819, or MOSFET 4101, as discussed above, for example.

A circuit die may be provided that comprises signal processing circuitry 930 and other signal processing circuitries. A detector may comprise a sensor layer, section layer, and read-out layer. Such layers may be provided as a plurality of discrete layers. However, it will be appreciated that the layers need not be provided as separate substrates. For example, a wiring path of a section may be provided in a sensor die including the plurality of sensing elements, or may be provided outside of the sensor die. Wiring paths may be patterned on the sensor layer or in other layers. Additionally, the section layer may be combined with the read-out layer. Thus, in some embodiments, the circuit die may include the section layer, signal processing circuitries, and read-out functionalities. Structures and functionalities of the various layers may be combined or divided.

Figure 16:
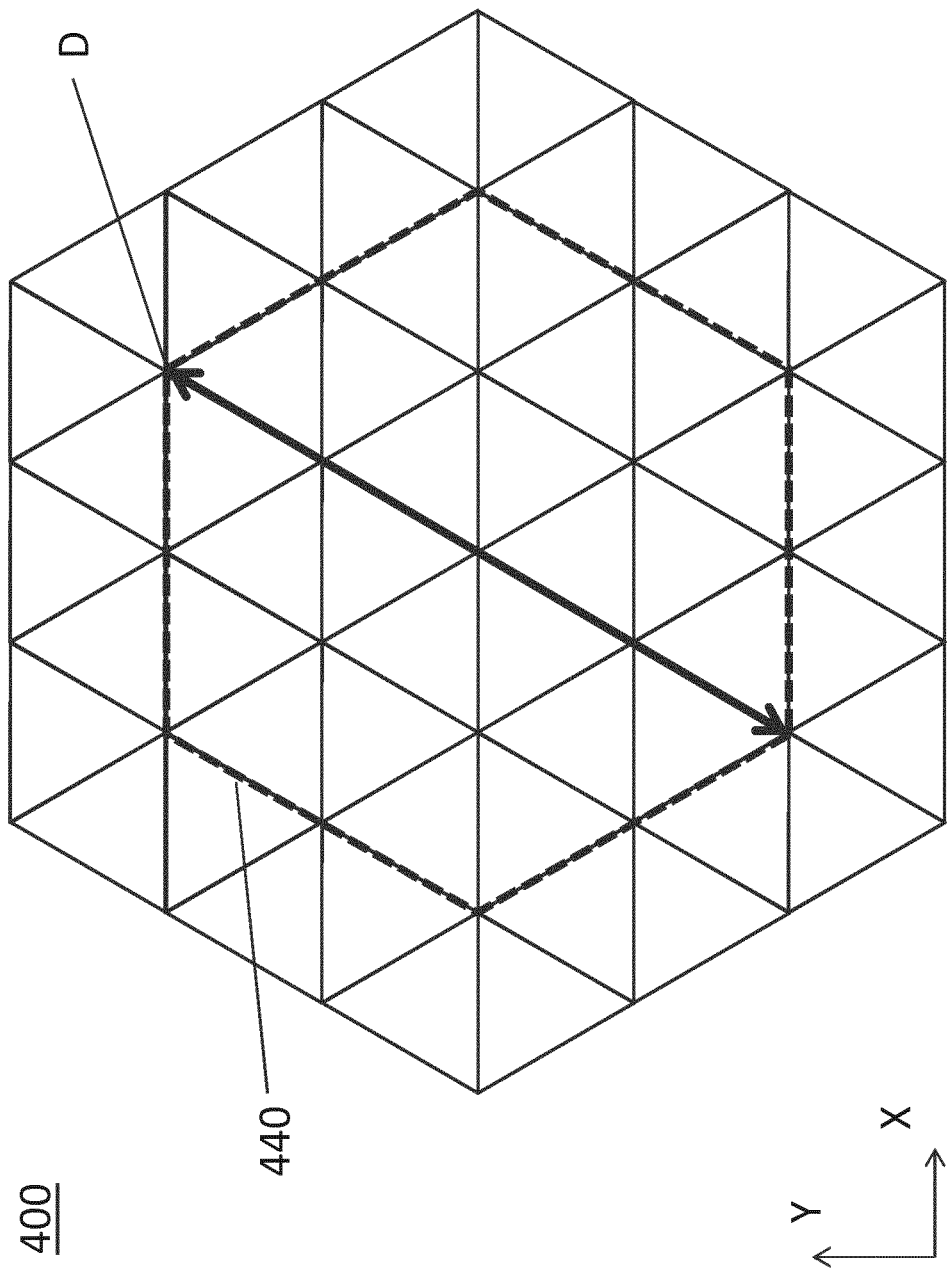
FIG. 16 is a schematic representation of an exemplary structure of a detector, consistent with embodiments of the present disclosure.

Furthermore, one or more switches may be provided between sensing elements and signal processing circuitries associated with the sections. Switches may be provided in line with or in addition to wiring paths of the sections. For example, as shown in FIG. 15, a switch 4019 is provided in-line with each wiring path 419. Switches 4019 may be arranged between the plurality of sensing elements and sections 410, 420, and 430. When such switches are provided, inactive sensing elements may be disconnected to reduce noise pickup, for example, among other technical effects While FIG. 14 shows sections 410, 420, and 430, a plurality of sections may be provided so as to completely cover all of the sensing elements in a detector. That is, a section arrangement may repeat arbitrarily. Various shapes and sizes of sections may also be used. Furthermore, the number of sensing elements associated with or contained in one section may be varied. Thus, while FIG. 14 shows 6 sensing elements being associated with one section, embodiments of the disclosure are not so limited. Sections may be associated with and may contain sensing elements in a number of 6, 24, 68, and so on, for example. FIG. 16 shows an example where a section 440 contains 24 sensing elements.

The sections may be uniform so that the sections have the same shape and the same size as one another. Each section may have corresponding signal processing circuitries and signal paths. Sensing elements of one section may be associated with the signal processing circuitries and signal paths of the corresponding section.

Criteria for determining a size of sections may be based on pitches of beamlets generated by EBI tool 104. For example, in some applications, a multi-beam apparatus may be used to generate a plurality of beamlets. Pitches of the beamlets may be determined by the structure of EBI tool 104 including, for example, source conversion unit 212 as shown in FIG. 2. Pitches of beamlets may be set based on a variety of parameters. In some embodiments, a charged particle beam system may be used that has a high density of beamlets.

Accordingly, a plurality of beams or beamlets may be incident on a detector surface. Beamlets may be configured to be projected onto a sample and subsequently received on the detector in an array pattern, such as a grid pattern. The grid pattern may be an arbitrary shape. For example, the grid pattern may be square, rectangular, tiled, etc. In a square grid pattern, for example, beamlets may be spaced so as to have a certain center-to-center distance in a first (horizontal) direction and in a second (vertical) direction.

As discussed above, a detector may have a plurality of sections. Criteria for determining section size may be that the diagonal size of the section is less than the length of the smallest spacing between adjacent beam spots. For example, a corner-to-corner distance (D) of a regular hexagon that forms a section may be set to be less than the center-to-center distance of the square grid pattern. Thus, under any variety of differing imaging conditions due to, for example varying alignment, beam shift, etc., at most only one beam center may fall into one section. In this way, there may be enough signal processing circuitries and signal paths to accommodate signal processing and readout of the beams projected on an area of the detector surface.

Using the above criteria, regardless of beam spot size, one beam spot center may be accommodated in one section. Furthermore, in some embodiments, even if the section arrangement is not aligned with the beam grid (for instance when the grid pattern is rotated relative to the section arrangement), the centers of two beam spots being in one section may be avoided. Thus, sensing elements associated with one section may have their output signals routed through respective sections that may have their own signal processing circuitries and wiring paths. Sensing elements grouped together for a beam spot may then have the signal of that beam spot routed through one signal processing circuitry of one of the sections to which the sensing elements in the group are associated. Thus, the length of a signal path for a beam spot may be minimized. Furthermore, bandwidth may be improved.

According to some exemplary embodiments, using triangular sensing elements may allow the following exemplary technical effects to be achieved. For example, the number of switches for grouping pixels and the amount of associated control logic may be reduced. Grouping of pixels may comprise connecting adjacent pixels that are covered by the same charged particle beam spot. Switches, such as switching elements provided in switching regions between adjacent sensing elements, may be controlled by one or more circuits that are provided in associated control circuitries.

Furthermore, higher detection speed may be realized, yielding higher throughput of a detection system. Additionally, more efficient charged particle beam detection may be achieved. For example, compared to rectangular shapes, hexagonal sections and triangular sensing elements may be more able to closely conform to the shape of a charged particle beam spot, which may be circular or elliptical.

Figure 17:
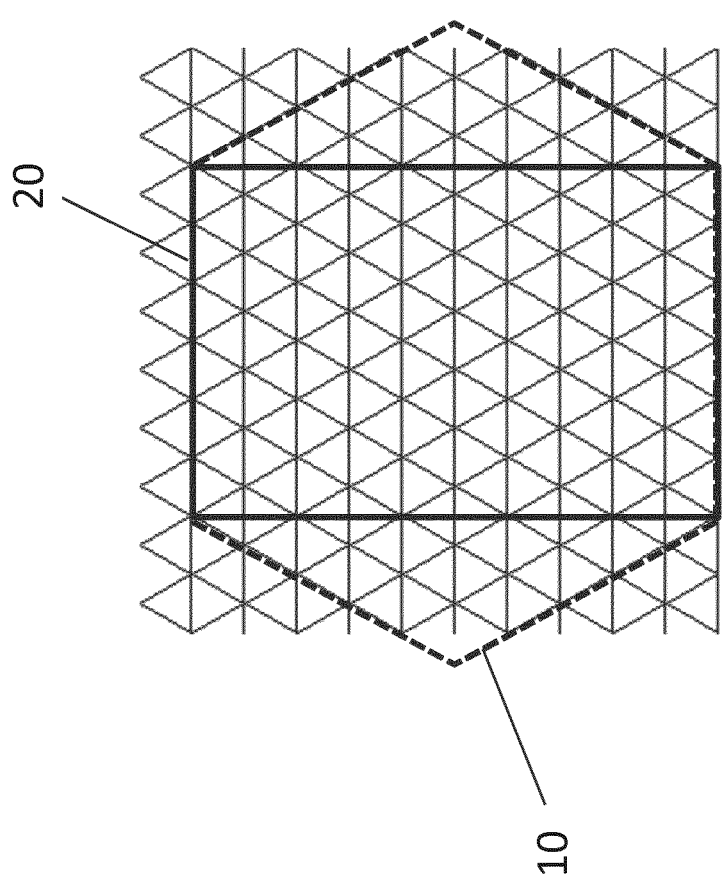
FIG. 17 is a schematic representation of an exemplary structure of a detector, consistent with embodiments of the present disclosure.

By using hexagonal sections, the number of sections and the number of signal paths in a circuit die may be reduced. For example, FIG. 17 shows a comparative example where a detector provided with a rectangular section 20 may have a smaller area than that of hexagonal section 10 when the diagonal dimensions of both the rectangular section 20 and the hexagonal section 10 are the same. In this manner, in some embodiments, for the same amount of active area of a detector array, it may be possible to reduce the number of sections and also the number of signal paths by providing hexagonal sections. Furthermore, a multiplexing system of routing outputs from sensing elements may be simplified.

It should be noted that in some situations, activated sensing elements from two or more different beam spots may be contained within one section. However, with sensing element merging, for example, sensing elements that are covered by the same beam spot may be merged so that their output is processed together. For example, the section that contains the beam spot center may be the section used for processing all the signals of the activated sensing elements associated with one beam spot. Therefore, sensing elements on the peripheries of the beam spot may use a wiring path of another section rather than the one in which the section was originally contained. Accordingly, the sensing elements on the peripheries of the beam spot may actually use a wiring path that is slightly longer than if the sensing element used the wiring path for the section stacked immediately below it. In this way, the detector array may remain flexible. Thus, at a given time, the number sensing elements that are associated with one section and thereby processed by the section may be less than, equal to, or larger than the number of sensing elements that may be contained within the predefined size of the section.

A detection system may thus prevent loss in flexibilities while providing enhancements in design simplicity, manufacturing cost, detection speed, and signal-to-noise ratio, for example.

The embodiments may further be described using the following clauses:

1. A detector comprising:
a substrate comprising a plurality of sensing elements including a first sensing element and a second sensing element; and
a switching region configured to connect the first sensing element and the second sensing element, wherein at least the first sensing element is formed in a triangular shape.

2. The detector of clause 1, wherein the first sensing element is configured to generate a first signal in response to the first sensing element detecting a beam, and the second sensing element is configured to generate a second signal in response to the second sensing element detecting the beam.

3. The detector of one of clauses 1 and 2, wherein the triangular shape is an equilateral triangle and the beam is a charged particle beam.

4. The detector of any of clauses 1 to 3, wherein each of the plurality of sensing elements are formed in a triangular shape.

5. The detector of any of clauses 1 to 4, wherein the switching region is provided between the first sensing element and the second sensing element in a horizontal direction perpendicular to a thickness direction of the substrate.

6. The detector of any of clauses 1 to 5, further comprising:
a sensor die that includes the substrate; and
a circuit die that includes one or more circuits.

7. The detector of clause 6, wherein the one or more circuits are configured to control the switching region.

8. The detector of any of clauses 6 and 7, wherein the one or more circuits comprise a plurality of circuitries configured to process outputs of the plurality of sensing elements.

9. The detector of any of clauses 1 to 8, wherein the first sensing element and the second sensing element are contiguous in a cross section.

10. The detector of any of clauses 1 to 9, wherein the switching region is integral with the first sensing element and the second sensing element.

11. The detector of any of clauses 1 to 10, wherein the substrate comprises:
in a thickness direction, a top metal layer configured as a detection surface, and a bottom metal layer,
wherein in a cross section, an entire area between the top layer and the bottom layer is a charge carrier region.

12. A detector comprising:
a substrate comprising a plurality of sensing elements having a triangular shape; and
a plurality of sections including a first section connecting a first group of the plurality of sensing elements to a first output and a second section connecting a second group of the plurality of sensing elements to a second output.

13. The detector of clause 12,
wherein the plurality of sections have a hexagonal shape.

14. The detector of one of clauses 12 and 13, further comprising:
a plurality of circuitries configured to process outputs of the plurality of sensing elements, wherein a first circuitry of the plurality of circuitries is connected to the first section and a second circuitry of the plurality of circuitries is connected to the second section.

15. The detector of clause 14, further comprising:
a switch provided on a wiring path between each of the plurality of sensing elements and the plurality of circuitries.

16. The detector of any of clauses 12 to 15, further comprising:
a sensor die that includes the substrate; and
a circuit die that includes one or more circuits configured to process output of the plurality of sensing elements.

17. The detector of clause 16, wherein the sensor die and the circuit die are stacked together so that the first group of the plurality of sensing elements is adjacent to the first section and the second group of the plurality of sensing elements is adjacent to the second section.

18. The detector of any of clauses 12 to 17, further comprising:
at least one switching region configured to connect two or more of the plurality of sensing elements.

19. The detector of clause 18, wherein the at least one switching region includes a switching region provided between each of the plurality of sensing elements.

20. The detector of clause 19, wherein in a cross sectional view of the substrate, the at least one switching region is integral with the two or more of the plurality of sensing elements.

21. The detector of any of clauses 12 to 20, wherein the plurality of sensing elements are contiguous in a cross section.

22. A detection system comprising:
a detector array including a plurality of sensing elements having a triangular shape;
a plurality of sections including a first section connecting a first group of the plurality of sensing elements to a first output and a second section connecting a second group of the plurality of sensing elements to a second output; and
an interface.

23. The detection system of clause 22, wherein the interface includes a digital switch.

24. The detection system of one of clauses 22 and 23, wherein the plurality of sections includes one of a wiring path and signal processing circuitries.

25. The detection system of any of clauses 22 to 24, further comprising:
a plurality of circuitries configured to process outputs of the plurality of sensing elements, wherein a first circuitry of the plurality of circuitries is connected to the first section and a second circuitry of the plurality of circuitries is connected to the second section.

26. The detection system of clause 25, further comprising:
a switch provided on a wiring path between each of the plurality of sensing elements and the plurality of circuitries.

27. The detection system of any of clauses 22 to 26, further comprising:
a sensor die that includes the plurality of sensing elements; and
a circuit die that includes one or more circuits configured to process output of the plurality of sensing elements.

28. The detection system of clause 27, wherein the sensor die and the circuit die are stacked together so that the first group of the plurality of sensing elements is adjacent to the first section and the second group of the plurality of sensing elements is adjacent to the second section.

29. The detection system of any of clauses 22 to 28, further comprising:
at least one switching region configured to connect two or more of the plurality of sensing elements.

30. The detection system of clause 29, wherein the at least one switching region includes a switch provided between each of the plurality of sensing elements in a horizontal direction perpendicular to a thickness direction of the detector array.

It will be appreciated that the present invention is not limited to the exact construction that has been described above and illustrated in the accompanying drawings, and that various modifications and changes may be made without departing from the scope thereof. For example, while some exemplary embodiments discuss sections that are hexagonal in shape, other arrangements may be implemented with shapes such as triangles, diamonds, and other polygons, etc. Sections may have shapes that are geometrically similar to those of the sensing elements associated with them. Sensing elements themselves may be formed in shapes other than square, rectangular, or triangular.

The invention claimed is:

1. A charged particle detector comprising:
   a substrate comprising a plurality of sensing elements including a first sensing element and a second sensing element; and
   a switching region configured to connect the first sensing element and the second sensing element, wherein at least the first sensing element is formed in a triangular shape.

2. The detector of claim 1, wherein the first sensing element is configured to generate a first electrical signal in response to the first sensing element detecting a first charged particle of a charged particle beam spot formed on the detector, and the second sensing element is configured to generate a second electrical signal in response to the second sensing element detecting a second charged particle of the charged particle beam spot.

3. The detector of claim 2, wherein the triangular shape is an equilateral triangle and the charged particle beam spot is an electron beam spot.

4. The detector of claim 1, wherein each of the plurality of sensing elements are formed in a triangular shape.

5. The detector of claim 1, wherein the switching region is provided between the first sensing element and the second sensing element in a horizontal direction perpendicular to a thickness direction of the substrate.

6. The detector of claim 1, further comprising:
   a sensor die that includes the substrate; and
   a circuit die that includes one or more circuits.

7. The detector of claim 6, wherein the one or more circuits are configured to control the switching region.

8. The detector of claim 6, wherein the one or more circuits comprise a plurality of circuitries configured to process outputs of the plurality of sensing elements.

9. The detector of claim 1, wherein the first sensing element and the second sensing element are contiguous in a cross section.

10. The detector of claim 1, wherein the switching region is integral with the first sensing element and the second sensing element.

11. The detector of claim 1, wherein the substrate comprises:
    in a thickness direction, a top metal layer configured as a detection surface, and a bottom metal layer,
    wherein in a cross section, an entire area between the top layer and the bottom layer is a charge carrier region.

12. The detector of claim 1, wherein the switching region comprises a charge carrier region between the first sensing element and the second sensing element, wherein the first sensing element, the second sensing element, and the switching region are contiguous along a first direction in which the first element and the second element are arranged.

13. The detector of claim 1, wherein the switching region comprises a channel between the first sensing element and the second sensing element.

14. The detector of claim 13, wherein the channel extends substantially a whole length of the first sensing element or the second sensing element.

15. The detector of claim 1, wherein the sensing elements are configured to generate signals in response to receiving charged particles.

16. A charged particle detection system comprising:
    a detector array including a plurality of sensing elements having a triangular shape, wherein the plurality of sensing elements are configured to generate signals in response to receiving charged particles;
    a plurality of sections including a first section connecting a first group of the plurality of sensing elements to a first output and a second section connecting a second group of the plurality of sensing elements to a second output; and
    an interface.

17. The detection system of claim 16, wherein the interface includes a digital switch.

18. The detection system of claim 16, wherein the plurality of sections includes one of a wiring path and signal processing circuitries.

19. The detection system of claim 16, further comprising:
    a plurality of circuitries configured to process outputs of the plurality of sensing elements, wherein a first circuitry of the plurality of circuitries is connected to the first section and a second circuitry of the plurality of circuitries is connected to the second section.

20. The detection system of claim 16, further comprising a switching region configured to connect a first sensing element of the plurality of sensing elements and a second sensing element of the plurality of sensing elements.

* * * * *